United States Patent
Leija et al.

(10) Patent No.: US 7,692,922 B2
(45) Date of Patent: Apr. 6, 2010

(54) HEATSINK, METHOD OF MANUFACTURING SAME, AND MICROELECTRONIC PACKAGE CONTAINING SAME

(75) Inventors: Javier Leija, Chandler, AZ (US); Ioan Sauciuc, Phoenix, AZ (US); Steve Frayne, Jr., San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 262 days.

(21) Appl. No.: 11/772,144

(22) Filed: Jun. 30, 2007

(65) Prior Publication Data

US 2009/0034197 A1    Feb. 5, 2009

(51) Int. Cl.
*H05K 7/20* (2006.01)

(52) U.S. Cl. ............ 361/694; 361/690; 165/80.3; 165/185

(58) Field of Classification Search ........ 361/690, 361/694; 165/80.3, 185; 415/125; 417/436, 417/410.1
See application file for complete search history.

(56) References Cited

U.S. PATENT DOCUMENTS

| | | | | |
|---|---|---|---|---|
| 4,923,000 A | * | 5/1990 | Nelson | 165/122 |
| 5,861,703 A | * | 1/1999 | Losinski | 310/330 |
| 5,921,757 A | * | 7/1999 | Tsutsui et al. | 417/410.2 |
| 6,043,978 A | * | 3/2000 | Mody et al. | 361/690 |
| 6,628,522 B2 | * | 9/2003 | Trautman et al. | 361/704 |
| 7,031,155 B2 | * | 4/2006 | Sauciuc et al. | 361/695 |
| 2006/0138905 A1 | | 6/2006 | Gonzales et al. | |
| 2007/0001550 A1 | | 1/2007 | Palanduz et al. | |
| 2007/0037506 A1 | | 2/2007 | Lee et al. | |
| 2008/0218972 A1 | * | 9/2008 | Sauciuc et al. | 361/704 |

FOREIGN PATENT DOCUMENTS

JP    10056215 A  *  2/1998

* cited by examiner

*Primary Examiner*—Boris L Chervinsky
(74) *Attorney, Agent, or Firm*—Kenneth A. Nelson

(57) ABSTRACT

A heatsink comprises a base (110, 210, 310), a fin (120, 220, 320) attached to the base, and a piezoelectric patch (130, 230, 330) attached to the fin. The piezoelectric patch causes the fin to oscillate, thus generating air circulation near the fin surface. This airflow disturbs the boundary layer near the fin and dramatically increases the heat transfer from the fin to air compared to a non-oscillating fin, even for the same bulk flow rate.

6 Claims, 4 Drawing Sheets

HEATSINK, METHOD OF MANUFACTURING SAME, AND MICROELECTRONIC PACKAGE CONTAINING SAME

FIELD OF THE INVENTION

The disclosed embodiments of the invention relate generally to microelectronic packages, and relate more particularly to thermal management of microelectronic packages.

BACKGROUND OF THE INVENTION

Computer chips and other microelectronic devices generate heat during their operation. If it is not properly addressed, the heat generated is capable of negatively affecting the performance of, or even damaging, such microelectronic devices. Current thermal management solutions include the use of rotary fans or blowers that generate airflow over stationary heatsink fins. This decoupled generation of airflow and heat transfer via airflow leads to less than optimal thermal performance.

BRIEF DESCRIPTION OF THE DRAWINGS

The disclosed embodiments will be better understood from a reading of the following detailed description, taken in conjunction with the accompanying figures in the drawings in which.

Figure 1:
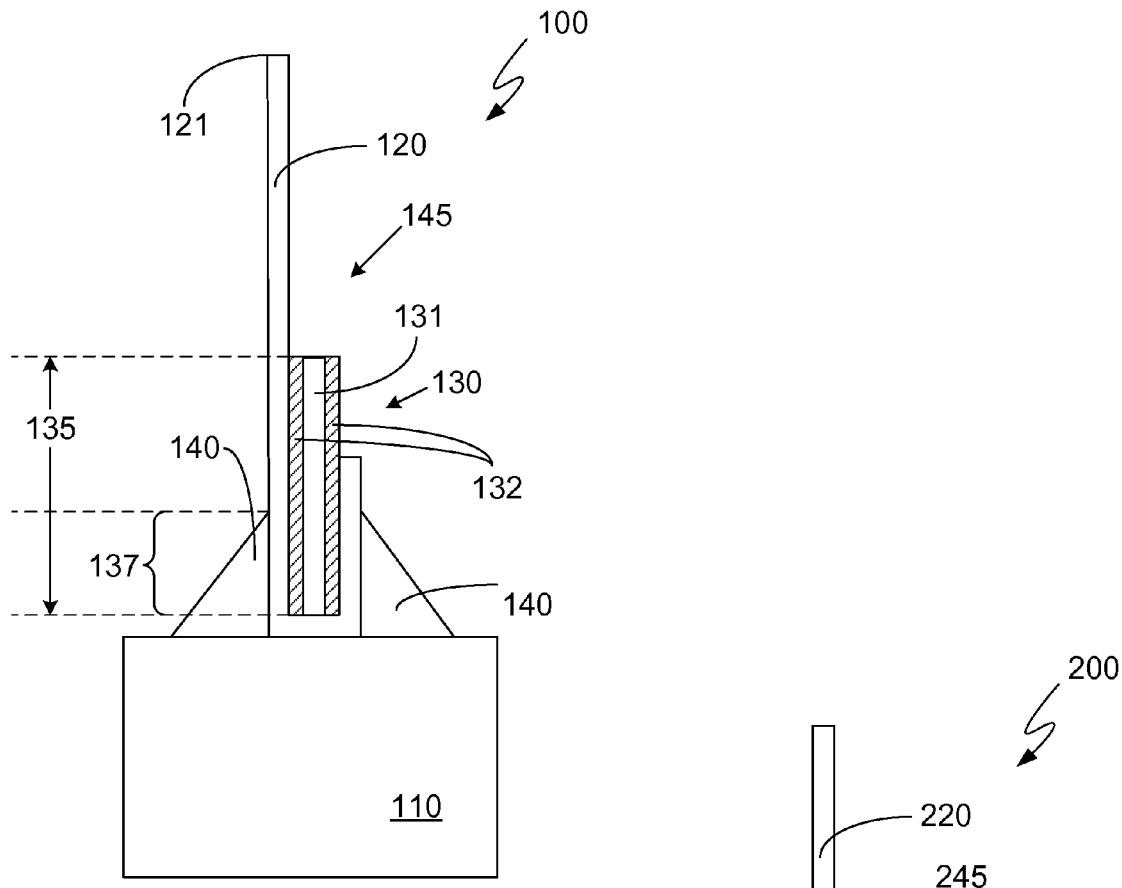
FIG. 1 is a front elevational view of a heatsink according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a heatsink comprises a base, a fin attached to the base, and a piezoelectric patch attached to the fine. When powered on with an applied alternating current the piezoelectric patch causes the fin to oscillate, thus generating air circulation near the fin surface. This airflow disturbs the boundary layer near the fin and dramatically increases the heat transfer from the fin to air compared to a non-oscillating fin, even for the same bulk flow rate. As discussed in more detail below, oscillating the fins to disturb the boundary layer may lead to several advantages, including better performance for natural convection heatsinks, better convective heat transfer, and substantially quieter cooling operation.

Referring now to the drawings, FIG. 1 is a front elevational view of a heatsink 100 according to an embodiment of the invention. As illustrated in FIG. 1, heatsink 100 comprises a base 110, a fin 120 attached to base 110, and a piezoelectric patch 130 that is securely attached to fin 120 using a typical adhesive as known in the art. Together, fin 120 and piezoelectric patch 130 make up a fin assembly 145. Heatsink 100 further comprises solder attach regions 140.

It may be seen that in the illustrated embodiment, fin 120 wraps around a portion of piezoelectric patch 130, a configuration that may offer manufacturing and/or assembly advantages. Having fin 120 wrap around piezoelectric patch 130 provides a solder attach location on both sides of piezoelectric patch 130. The stated configuration also allows fin assembly 145 to be mated and held together as a rigid assembly.

As an example, fin 120 may be at least approximately four or five centimeters long, with longer fins generally leading to better performance. In one embodiment, base 110 has a width of approximately 60-100 millimeters. More generally, depending on boundary conditions such as power, heat source size, operating temperature, airflow rate, and the like, the heatsink geometry can be optimized for performance improvement.

As an example, fin 120 can be made of plastic, metal, or another flexible and thermally conductive material. A good material candidate will, in at least one embodiment, offer a good balance between flexibility and thermal conductivity. As a particular example, fin 120 can be made of beryllium copper, aluminum, graphite, or the like.

Piezoelectric patch 130 comprises a piezoelectric layer 131 between metal electrodes 132. FIG. 1 illustrates piezoelectric patch 130 as having a single piezoelectric layer and two metal electrodes, one on either side of the piezoelectric layer. Non-illustrated embodiments may have a greater number of piezoelectric layers, each of which are located between a pair of metal electrodes. In general, performance increases with the number of layers making up piezoelectric patch 130. Care must be taken, however, to keep the total number of layers (including metal electrode layers and piezoelectric layers) small enough that the stiffness of piezoelectric patch 130 does not become too great. In that regard, a piezoelectric patch having from one to approximately ten or so piezoelectric layers would typically be appropriate.

As an example, metal electrodes 132 can be made of a highly electrically conductive material such as nickel, silver palladium, or the like having a thickness of between approximately three and approximately eight micrometers. As another example, piezoelectric layer 131 can be made of lead zirconium titanate (PZT) or a lead-free piezoelectric material such as bismuth titanate or the like. Alternatively, piezoelectric layer 131 can be made of another piezoelectric material, including piezoelectric polymers. In one embodiment, piezoelectric layer 131 has a thickness no greater than approximately 30 micrometers.

Governed by what may be called the reverse piezoelectric effect, piezoelectric material undergoes a small change in length when it is subjected to an externally applied voltage. If the applied voltage takes the form of an alternating current then the piezoelectric material can be caused to cycle rapidly between relaxed and constricted states and, as known in the art, this provides a way to induce a lateral vibration in a fin or other object attached to the piezoelectric material. This concept may be put to use with heatsink 100 by applying an alternating current to piezoelectric layer 131 in order to cause a simultaneous lateral vibration of fin 120. Such vibration of fin 120 disturbs a boundary layer of air around heatsink 100, thus significantly improving convective heat transfer.

More specifically, piezoelectric patch 130 vibrates when subjected to an alternating electrical current, resulting in a lateral vibration of fin 120. A free end 121 of fin 120 is driven back and forth by the piezoelectric action and this motion effectively dissipates energy from fin 120 to the local air. This arrangement significantly enhances heat transfer and can even generate flow for heat sinks in the absence of a fan.

Referring still to FIG. 1, piezoelectric patch 130 has a length 135 and a clamped portion 137. Clamped portion 137 is the portion of piezoelectric patch 130 that is clamped to base 110. In FIG. 1 such clamping is accomplished by solder attach regions 140, which secure piezoelectric patch 130 and fin 120 to base 110, and clamped portion 137 is the portion of piezoelectric patch 130 below a top of solder regions 140. The percentage of piezoelectric patch 130 that is clamped affects the deflection of the tip or free end (the end opposite piezoelectric patch 130) of fin 120. For example, at 60 Hz (a typical frequency available from household power), fin 120 will not deflect if greater than 20 percent of piezoelectric patch 130 is fixed (clamped). The oscillation of fin 120 is optimized when less than 20 percent of piezoelectric patch 130 is clamped. Accordingly, in one embodiment clamped portion 137 represents less than 20 percent of length 135.

Figure 2:
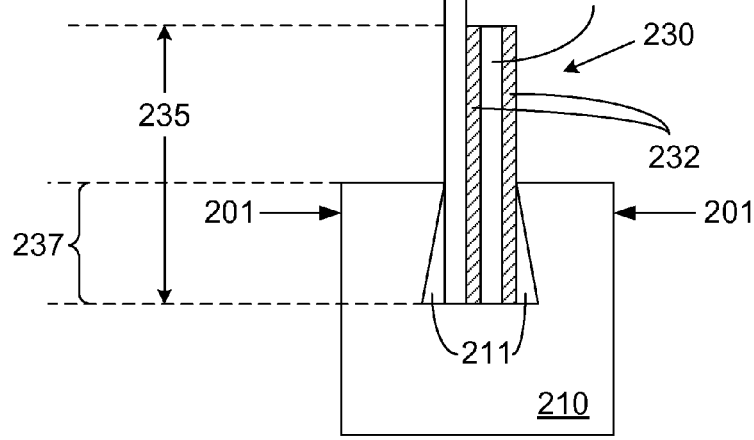
FIG. 2 is a front elevational view of a heatsink according to a different embodiment of the invention.

FIG. 2 is a front elevational view of a heatsink 200 according to an embodiment of the invention. As illustrated in FIG. 2, heatsink 200 comprises a base 210, a fin 220 attached to base 210, and a piezoelectric patch 230 that is securely attached to fin 220 using a typical adhesive as known in the art. Together, fin 220 and piezoelectric patch 230 make up a fin assembly 245. Base 210 contains a cavity 211. Piezoelectric patch 230 comprises a piezoelectric layer 231 in between metal electrodes 232. As an example fin 220 and piezoelectric patch 230, including piezoelectric layer 231 and metal electrodes 232, can be similar to, respectively, fin 120, piezoelectric patch 130, piezoelectric layer 131, and metal electrodes 132, all of which are shown in FIG. 1.

Heatsink 200 differs from heatsink 100 in the way the fins and the piezoelectric patches are attached to the bases. As depicted in FIG. 2, a portion of fin 220 and a portion of piezoelectric patch 230 are inserted into cavity 211 and base 210 is crimped such that fin 220 and piezoelectric patch 230 are fixed in place inside cavity 211. The crimp load is indicated by arrows 201.

Piezoelectric patch 230 has a length 235 and a clamped portion 237. Clamped portion 237 is the portion of piezoelectric patch 230 that is clamped to base 210. In FIG. 2, clamped portion 237 is the portion of piezoelectric patch 230 that is in cavity 211. As was the case with piezoelectric patch 130 in FIG. 1, the percentage of piezoelectric patch 230 that is clamped affects the deflection of the tip or free end (the end opposite piezoelectric patch 230) of fin 220. For example, at 60 Hz, fin 220 will not deflect if greater than 20 percent of piezoelectric patch 230 is fixed (clamped). The oscillation of fin 220 is optimized when less than 20 percent of piezoelectric patch 230 is clamped. Accordingly, in one embodiment clamped portion 237 represents less than 20 percent of length 235.

Figure 3:
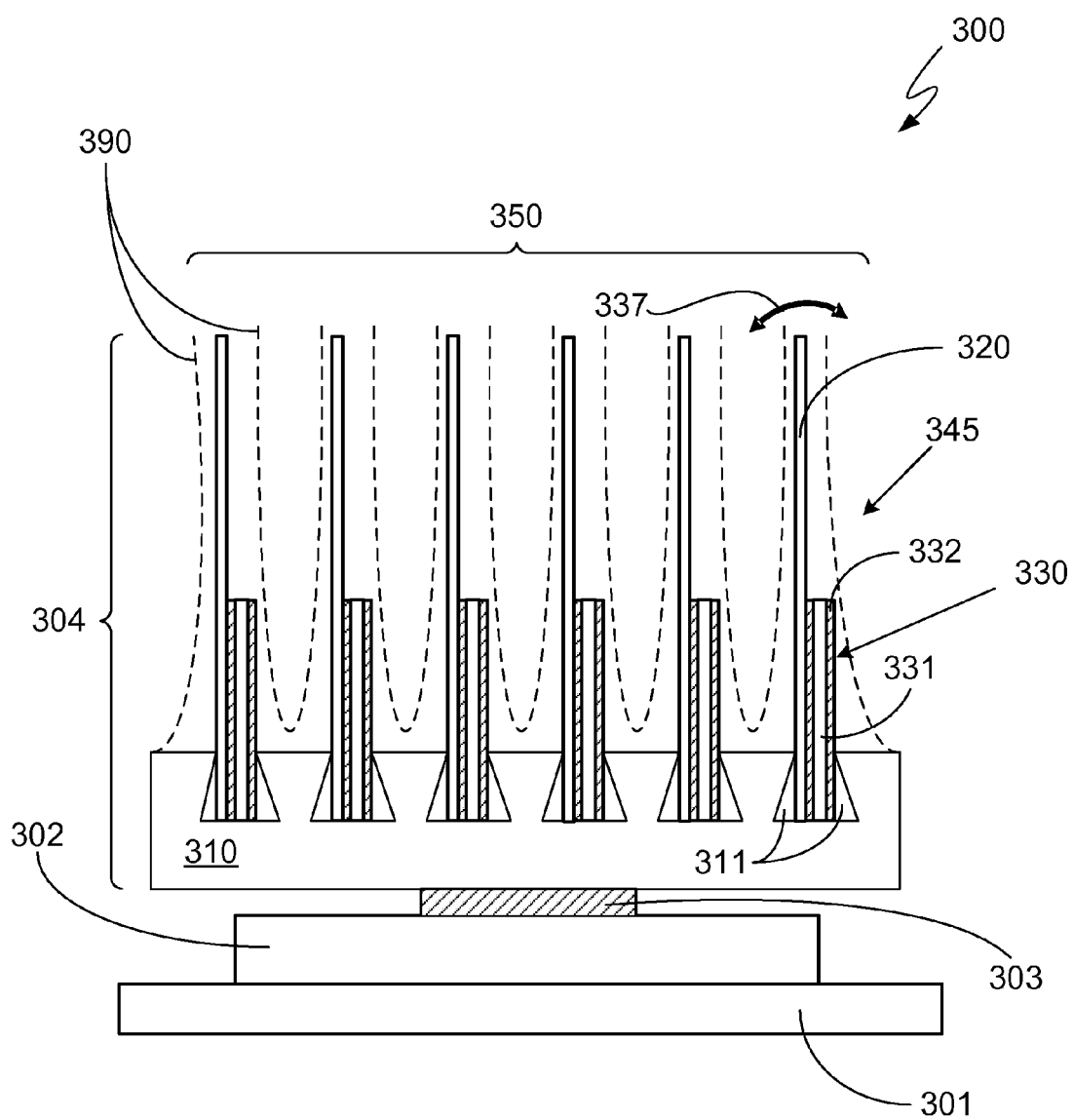
FIG. 3 is a front cross-sectional view of a microelectronic package containing a heatsink according to an embodiment of the invention.

In one embodiment of the invention, heatsink 100, heatsink 200, and/or another heatsink comprises a plurality of fins attached to a base, with a piezoelectric patch attached to each one of the plurality of fins. Such an embodiment is shown in FIG. 3, which is a front cross-sectional view of a portion of a microelectronic package 300 according to an embodiment of the invention. As illustrated in FIG. 3, microelectronic package 300 comprises a printed circuit board (PBC) 301, a substrate 302 over PCB 301, a die 303 over substrate 302, and a heatsink 304 over die 303. Heatsink 304 functions to remove heat generated by die 303 from microelectronic package 300 as has been discussed herein and as will be further discussed below. (In a non-illustrated embodiment, microelectronic package could be an IC package, a heat dissipating package, or the like, possibly including an integrated heat spreader (IHS) or the like.)

Heatsink 304 comprises a base 310, a fin 320 attached to base 310, and a piezoelectric patch 330 that is securely attached to fin 320 using a typical adhesive as known in the art. Together, fin 320 and piezoelectric patch 330 make up a fin assembly 345. Base 310 contains a cavity 311. Piezoelectric patch 330 comprises a piezoelectric layer 331 in between metal electrodes 332. As an example base 310, cavity 311, fin 320, and piezoelectric patch 330, including piezoelectric layer 331 and metal electrodes 332, can be similar to, respectively, base 210, cavity 211, fin 220, piezoelectric patch 230, piezoelectric layer 231, and metal electrodes 232, all of which are shown in FIG. 2. Not illustrated, but also possible according to an embodiment of the invention, is a heatsink comprising a plurality of fin assemblies that are attached to a heatsink base using solder regions in a manner similar to that shown in and described in connection with FIG. 1. As an example, that non-illustrated heatsink can comprise a plurality of solder regions, where each one of the plurality of solder regions anchors one of the plurality of fin assemblies to the base.

As a consequence of air flowing over plurality 350 of fin assemblies, a boundary layer 390 is created around each fin 320 of heatsink 304. The boundary layer, which is due to friction between surfaces of the fins and the air at those surfaces, reduces the heat transfer capability of the fins to the air. This reduction in heat transfer capability may be overcome if boundary layer 390 is disturbed such that air is not allowed to stop on the fins. Heatsink 304 disturbs boundary layer 390 by oscillating the fins. (The oscillation is in the direction of an arrow 337.) This oscillation generates air circulation near the fin surface which results in a significant improvement of the convective heat transfer. It should also be noted that the fins only need to oscillate a small amount, such as, for example, approximately 10 micrometers or so, to disturb the boundary layer.

As shown in FIG. 3, fin 320 is one of a plurality of fins attached to base 310, piezoelectric patch 330 is one of a plurality of piezoelectric patches, and each one of the plurality of fins is attached to one of the plurality of piezoelectric patches. Accordingly, fin assembly 345 is one of a plurality 350 of fin assemblies, each one of which can be similar to fin assembly 345 and each one of which can be attached to base 310 in a manner similar to that shown in and described in connection with FIG. 2. Accordingly, base 310 may contain a plurality of recesses (not shown in FIG. 3) in which a portion of each one of the plurality of fin assemblies is located, and a portion such as a sidewall (not shown) of each one of the plurality of recesses may be made to contact the portion of the fin assembly contained therein such that the fin assembly is held in place in the recess.

Figure 4:
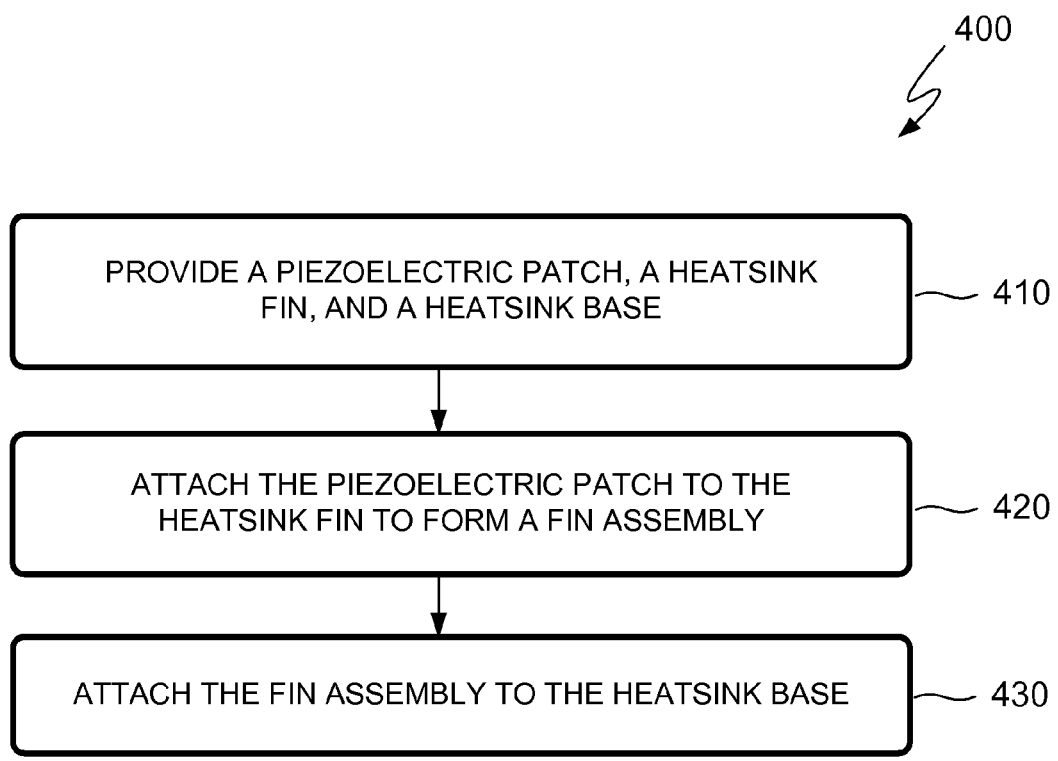
FIG. 4 is a flowchart illustrating a method of manufacturing a heatsink according to an embodiment of the invention.

FIG. 4 is a flowchart illustrating a method 400 of manufacturing a heatsink according to an embodiment of the invention. A step 410 of method 400 is to provide a piezoelectric patch, a heatsink fin, and a heatsink base. As an example, the piezoelectric patch, the heatsink fin, and the heatsink base can be similar to, respectively, piezoelectric patch 130, fin 120, and base 110, all of which are shown in FIG. 1.

In one embodiment, step 410 comprises providing a plurality of piezoelectric patches and a plurality of heatsink fins, and step 410 or another step comprises attaching each one of the plurality of fins to one of the plurality of piezoelectric patches in order to form a plurality of fin assemblies and still further comprises attaching each one of the plurality of fin assemblies to the heatsink base. In one manifestation of such an embodiment, the heatsink may be similar to heatsink 304 that is shown in FIG. 3.

A step 420 of method 400 is to attach the piezoelectric patch to the heatsink fin to form a fin assembly. As an example, the fin assembly can be similar to fin assembly 145 that is shown in FIG. 1. In one embodiment, step 420 comprises allowing a tip of the heatsink fin to oscillate with an amplitude of at least approximately ten micrometers.

A step 430 of method 400 is to attach the fin assembly to the heatsink base. In one embodiment, step 430 comprises clamping the fin assembly such that a portion of the piezoelectric patch is fixed with respect to the base and can't move. In one embodiment the fixed or clamped portion is less than 20 percent of a length of the piezoelectric patch.

In a particular embodiment, step 430 comprises clamping the fin assembly by soldering the fin assembly to the heatsink base. As an example, this embodiment can be similar to that illustrated in and described in connection with FIG. 1. In a different particular embodiment step 430 comprises clamping the fin assembly by forming a recess in the heatsink base, placing an end of the fin assembly in the recess, and crimping the recess such that the end of the fin assembly is retained in the recess.

Figure 5:
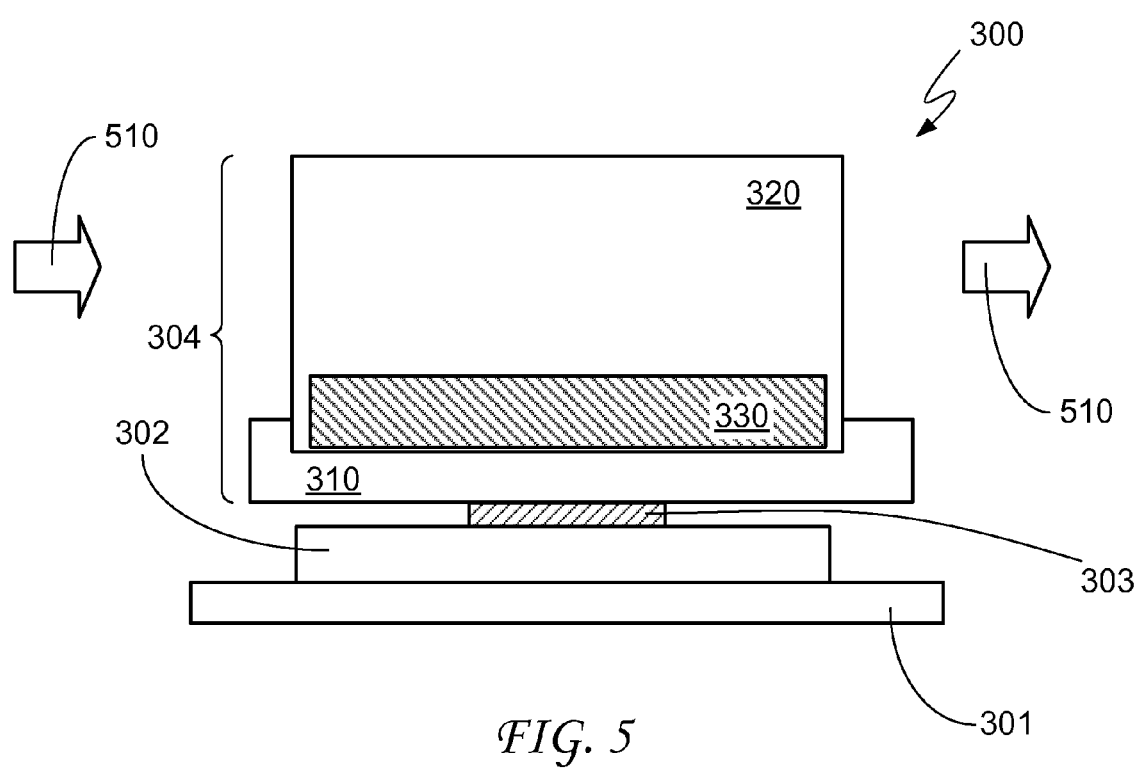
FIG. 5 is a side elevational view of the microelectronic package of FIG. 3 according to an embodiment of the invention.

FIG. 5 is a side elevational view of microelectronic package 300 according to an embodiment of the invention. FIG. 5 depicts heatsink 304 being used to improve the cooling capacity for a forced convection thermal solution. A fan or blower (not shown) provides cross directional airflow over heatsink 304 as indicated by arrows 510. As discussed above, the formation of a boundary layer (see FIG. 3 for example) is prevented as fin 320 oscillates in the air flow to generate air circulation near the surface of fin 320 as piezoelectric patch 330 receives an alternating current. As mentioned, this results in a significant improvement of the convective heat transfer in the form of an increase in heat transfer from fin to air. (Alternatively, the oscillation of fin 320 may be thought of as disturbing a boundary layer such that the boundary layer is prevented from significantly degrading convective heat transfer.) It should be noted that the beneficial thermal management effects created by disturbing the boundary layer (or by preventing its formation) are available not only for the forced air environment discussed above but also in natural air convection environments that do not include a fan or other device that forces the air movement.

An exemplary heatsink according to an embodiment of the invention will now be discussed. The given dimensions and other parameters are offered as examples of a possible manifestation of one particular embodiment of the invention but are not intended to limit the scope of the appended claims in any way. The exemplary heatsink (including base and fins) may be 70 millimeters (mm) long, 70 mm wide, and 60 mm high. The heatsink base may be 8 mm thick. Each of the fins may be 0.5 mm thick, and the gap between adjacent fins may be 6 mm wide. The thermal conductivity, both of the fins and the base, may be 360 Watts per meter-Kelvin (W/mK). The heat source may be 20 mm long by 20 mm wide.

A heatsink having the foregoing dimensions and other parameters has been shown to have a convective heat transfer coefficient h of approximately 8 $W/m^2K$ for natural convection (convection without the benefit of fin oscillation according to embodiments of the invention) and of approximately 15 $W/m^2K$ for piezo-assisted convection according to embodiments of the invention. (The convection area of the piezo-assisted heatsink is reduced by approximately 25 percent due to the fact that piezoelectric material blocks the convection that would otherwise occur at the lower part of the fin.) The thermal resistance from the base of the heatsink to the ambient air (in degrees Celsius per Watt) is approximately 1.8 for natural convection and approximately 1.4 for piezo-assisted convection, an improvement of approximately 20 percent for the piezo-assisted heatsink.

As suggested by the foregoing discussion, embodiments of the invention generate air flow and enhanced convective heat transfer without the noise or cost of a fan, resulting in better performance for natural convection heatsinks. Furthermore, as mentioned, embodiments of the invention may result in better convective heat transfer. This is especially true for tall, forced air convection heatsinks because the vibrating fins will have higher amplitudes, thus disturbing the boundary layer even more, increasing the heat transfer coefficient. Still further, embodiments of the invention may permit dramatically improved convection without a fan, thus allowing a computer using an embodiment of the invention to run without a fan on during most low-impact usage models. In some designs a fan would be required only for high impact usage models. This permits the computer to be substantially quieter (or even silent) most of the time. Even during high usage the computer may still be substantially quieter than computers with existing cooling systems.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the heatsink and related microelectronic packages and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A heatsink comprising:
   a base;
   a plurality of fins attached to the base; and
   a plurality of piezoelectric patches,
   wherein:
   each one of the plurality of fins is attached to one and only one of the plurality of piezoelectric patches;
   the base comprises a plurality of recesses;
   a portion of each one of the plurality of fin assemblies is in one of the plurality of recesses; and
   a portion of each one of the plurality of recesses contacts the portion of the fin assembly contained therein such that the fin assembly is held in place in the one of the plurality of recesses.

2. The heatsink of claim 1 wherein:
   the plurality of fins are made of one of beryllium copper, aluminum, and graphite.

3. The heatsink of claim 1 wherein:
   each one of the piezoelectric patches has a length;
   each one of the plurality of piezoelectric patches comprises a clamped portion; and
   the clamped portion represents less than 20 percent of the length.

4. A microelectronic package comprising:
   a substrate;
   a die attached to the substrate; and
   a heatsink over the die, the heatsink comprising:
      a base; and
   a plurality of fin assemblies attached to the base,
   wherein:
   each one of the plurality of fin assemblies comprises a fin and a piezoelectric patch attached to the fin;
      the base comprises a plurality of recesses;
      a portion of each one of the plurality of fin assemblies is in one of the plurality of recesses; and
      a portion of each one of the plurality of recesses contacts the portion of the fin assembly contained therein such that the fin assembly is held in place in the one of the plurality of recesses.

5. The microelectronic package of claim 4 wherein:
   each fin is made of one of beryllium copper, aluminum, and graphite.

6. The microelectronic package of claim 5 further comprising:
   a plurality of solder regions, each one of the plurality of solder regions anchoring one of the plurality of fin assemblies to the base.

* * * * *